US011205622B2

(12) United States Patent
Ong et al.

(10) Patent No.: US 11,205,622 B2
(45) Date of Patent: Dec. 21, 2021

(54) STIFFENER SHIELD FOR DEVICE INTEGRATION

(71) Applicant: Intel Corporation, Santa Clara, CA (US)

(72) Inventors: Jenny Shio Yin Ong, Bayan Lepas (MY); Seok Ling Lim, Kulim (MY); Bok Eng Cheah, Bukit Gambir (MY); Jackson Chung Peng Kong, Tanjung Tokong (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/423,561

(22) Filed: May 28, 2019

(65) Prior Publication Data

US 2020/0006247 A1  Jan. 2, 2020

(30) Foreign Application Priority Data

Jun. 28, 2018 (MY) .......................... PI 2018001200

(51) Int. Cl.
*H01L 23/552* (2006.01)
*H01L 23/522* (2006.01)

(52) U.S. Cl.
CPC ........ *H01L 23/552* (2013.01); *H01L 23/5226* (2013.01)

(58) Field of Classification Search
CPC ... H01L 23/552; H01L 23/5226; H01L 24/16; H01L 24/17; H01L 24/32; H01L 24/73; H01L 2224/32225; H01L 2224/73204; H01L 2224/16145; H01L 2224/16146; H01L 2224/13025; H01L 2224/17181; H01L 2924/15192; H01L 2924/19105; H01L 2924/3025; H01L 2924/15153; H01L 2924/15311; H01L 2924/19042; H01L 2924/19043; H01L 2924/19041; H01L 2224/16235; H01L 25/50; H01L 25/16; H01L 2224/16227

See application file for complete search history.

(56) References Cited

U.S. PATENT DOCUMENTS

2004/0070058 A1* 4/2004 Joshi ...................... H01L 23/42
257/678
2014/0048326 A1* 2/2014 Lin ...................... H05K 1/0216
174/377

* cited by examiner

*Primary Examiner* — Nelson Garces
*Assistant Examiner* — Sue Tang
(74) *Attorney, Agent, or Firm* — Schwegman Lundberg & Woessner, P.A.

(57) ABSTRACT

To overcome the problem of devices in a multi-chip package (MCP) interfering with one another, such as through electromagnetic interference (EMI) and/or radio-frequency interference (RFI), the chip package can include an electrically conductive stiffener that at least partially electrically shields the devices from one another. At least some of the devices can be positioned in respective recesses in the stiffener. In some examples, when the devices are positioned in the recesses, at least one device does not extend beyond a plane defined by a first side of the stiffener. Such shielding can help reduce interference between the devices. Because device-to-device electrical interference can be reduced, devices on the package can be positioned closer to one another, thereby reducing a size of the package. The devices can electrically connect to a substrate via electrical connections that extend through the stiffener.

16 Claims, 14 Drawing Sheets

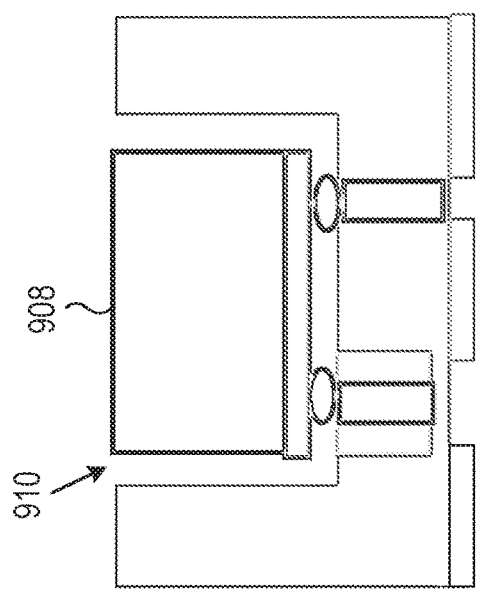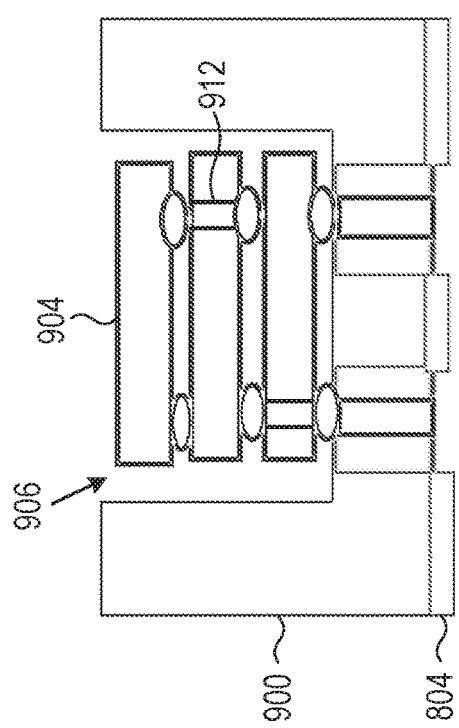
FIG. 9

STIFFENER SHIELD FOR DEVICE INTEGRATION

PRIORITY

This application claims the benefit of priority to Malaysia Application Serial No. 201800120, filed Jun. 28, 2018, which is incorporated by reference herein in its entirety.

FIELD OF THE DISCLOSURE

The present disclosure relates generally to an electrically conductive stiffener that at least partially electrically shields devices in a multi-device package from one another.

BACKGROUND OF THE DISCLOSURE

As technology evolves, and circuitry shrinks in size, it can be difficult to allocate volume within a package to accommodate electrical components. In some cases, positioning elements too close together can cause the dies in a multi-chip package to electrically interfere with a processor or with one another.

BRIEF DESCRIPTION OF THE DRAWINGS

FIGS. 4-12 show an assembly process for a chip package, as various components of the chip package are formed and attached to one another, in accordance with some examples.

Figure 1:
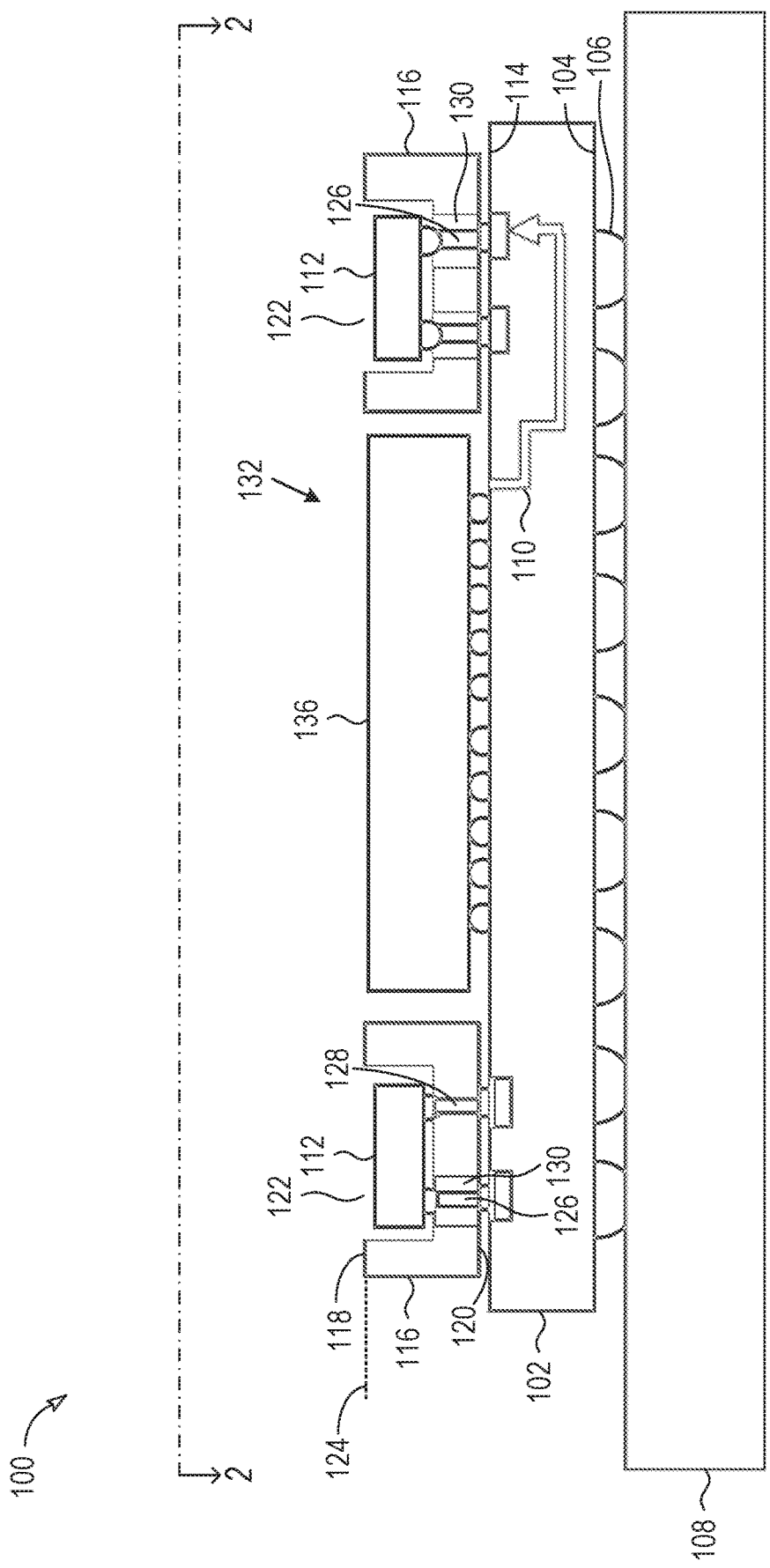
FIG. 1 shows a cross-sectional side view of an example of a chip package that includes an electrically conductive stiffener, in accordance with some examples.

Corresponding reference characters indicate corresponding parts throughout the several views. Elements in the drawings are not necessarily drawn to scale. The configurations shown in the drawings are merely examples, and should not be construed as limiting the scope of the inventive subject matter in any manner.

DETAILED DESCRIPTION

To overcome the problem of devices in a multi-chip package (MCP) interfering with one another, such as through electromagnetic interference (EMI) and/or radio-frequency interference (RFI), the chip package can include an electrically conductive stiffener that at least partially electrically shields the devices from one another. Such shielding can help reduce interference between the devices. Because the electrically conductive stiffener can reduce device-to-device electrical interference, the electrically conductive stiffener can allow devices on the package to be positioned closer to one another, thereby reducing a size of the package, and consequently potentially reducing a time delay for electrical signals to travel from device to device.

For example, a plurality of dies can be positioned in respective recesses in the stiffener. The dies can electrically connect to a substrate via electrical connections that extend through the stiffener. The recesses can have a same depth, so that the stiffener has a reduced thickness in the recess areas, and a nominal thickness away from the recesses. The reduced and nominal thicknesses can differ by an amount greater than a height of at least one of the dies, so that when the dies are positioned in the recesses, the at least one die does not extend beyond a plane defined by a first side of the stiffener. Further, the stiffener can at least partially electrically shield the dies from one or more chips, connected to the substrate, which can extend through a central hole in the stiffener.

In the figures and the text that follows, the terms "top" and "bottom" are used to show orientations of particular features on particular elements, or relative orientations of one element to another element. The designations of top and bottom are used merely for convenience and clarity, and are not intended to represent absolute orientation or direction. For example, a "top" surface of an element remains a top surface regardless of an absolute orientation of the element, even if the element is inverted during storage or use. This document uses the common convention of a chip package being positioned on top of a motherboard, which establishes directions of up and down, and top and bottom, relative to this convention.

Figure 2:
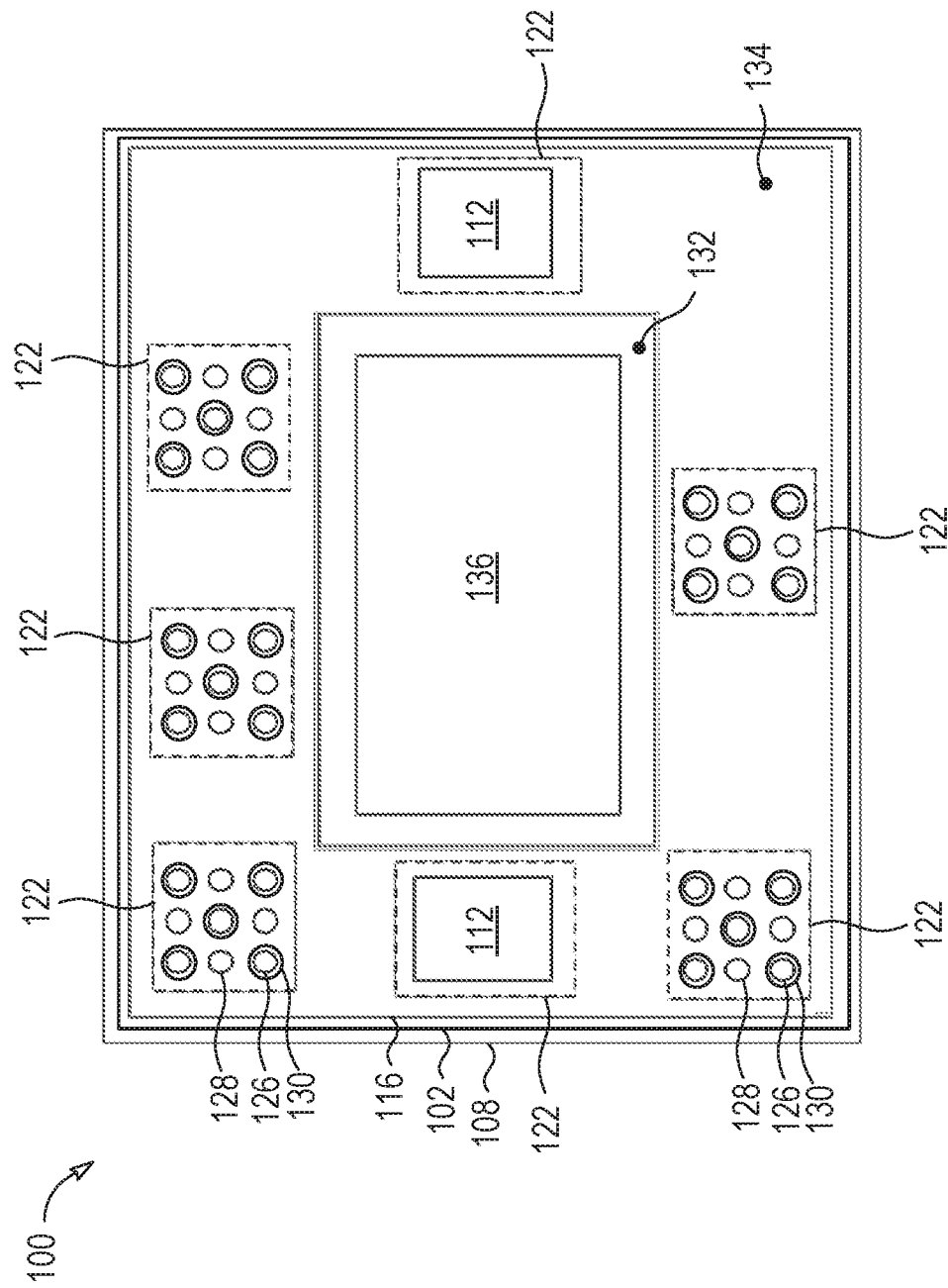
FIG. 2 shows a top view of the chip package of FIG. 1, in accordance with some examples.

FIG. 1 shows a cross-sectional side view of an example of a chip package 100 that includes an electrically conductive stiffener, in accordance with some examples. FIG. 2 shows a top view of the chip package 100 of FIG. 1, in accordance with some examples. The configuration of FIGS. 1 and 2 is but one example of such a chip package; other configurations can also be used.

A package substrate 102 can have a bottom surface 104 that can electrically connect via solder balls 106 to a printed circuit board 108, such as a motherboard. The package substrate 102 can include internal circuitry 110 that can connect the printed circuit board 108 to one or more components 112 electrically connected to a top surface 114 of the package substrate 102. Such components 112 can include semiconductor memory, such as dynamic random-access memory (DRAM), integrated circuits, such as radio frequency integrated circuits, WIFI integrated circuits, or other active components. Such components 112 can also include passive components, such as one or more capacitors, resistors, and/or inductors. Such components 112 can also include dies, which can connect to the top surface 114 of the package substrate 102 through the stiffener, as explained below. In some examples, the components 112 can optionally include stacked memory 312 (FIG. 3), or other stacked components.

A stiffener 116 can be coupled to the package substrate 102. In some examples, the stiffener 116 can be formed from a rigid material. In some examples, the package substrate 102 can extend over a substrate area, and the stiffener 116 can extend over a stiffener area smaller than the substrate area. In some of these examples, there can be a margin of material around the perimeter of the package substrate 102, which extends beyond the substrate area.

The stiffener 116 can have a first side 118 and a second side 120 opposite the first side 118. In some examples, the first side 118 can be generally flat, with recesses 122 that extend into the stiffener 116, and various electrical connection locations positioned in the recesses 122. In some examples, the second side 120 can also be generally flat, with various electrical connection locations positioned over the second side 120. In some examples, the second side 120 of the stiffener 116 can be planar, and the first side 118 of the stiffener 116, away from any recesses 122, can define a plane 124 that is parallel to the second side 120.

The stiffener 116 can include one or more recesses 122 on the first side 118. In some examples, the recesses 122 can extend only partially into the stiffener 116, and not extend fully through the stiffener 116. In some examples, the recesses 122 can have a same depth, so that the stiffener 116 has a reduced thickness in the recess areas, and a nominal thickness away from the recesses 122. Additional depths can also be used. In some of these examples, the reduced and nominal thicknesses can differ by an amount greater than a height (e.g., a z-height, or a vertical height) of at least one of the components 112, so that when the components 112 are positioned in the recesses, the at least one component 112 does not extend beyond the plane 124 defined by the first side 118 of the stiffener 116.

Each recess 122 can extend over a respective recess area on the first side. In some examples, the recess areas can be sized and shaped to accommodate the sizes and shapes of respective dies. For example, for a generally planar die that has a particular length and a particular width, the corresponding recess can have a slightly larger length than the particular length and a slightly larger width than the particular width, so that when the die is inserted into the recess, the die can have a clearance around its perimeter that can account for tooling clearances and typical manufacturing and alignment tolerances.

Each recess area can include a respective plurality of electrical connections 126 that extend through the stiffener 116 to the second side 120 of the stiffener 116. In some examples, each electrical connection 126, such as for signal input/output (I/O) or power routing, can be insulated by a dielectric layer 130. In some examples, the electrical connection 126, such as for signal input/output (I/O) or power routing, can include electrically conducting material shaped into a vertically-extending member that is laterally (e.g., horizontally) surrounded by a dielectric (e.g., non-conductive) material.

In some examples, at least one electrical connection 126, such as electrical connection 128, can be electrically connected to a reference voltage, such as a ground (Vss) reference voltage, through circuitry in the package substrate 102. In some examples, the electrical connection 128 can lack the surrounding dielectric material, and can be in direct contact with the stiffener 116, so that the stiffener 116 can be electrically connected to the reference voltage, such as ground. Setting the stiffener 116 to a reference voltage, such as ground, can provide additional electrical shielding in a multi-device package. Referring to FIG. 2, only two recesses (out of seven recesses) are shown with the components 112. The components 112 of the remaining five recesses were omitted to illustrate the top view of the electrical connection 126 and the Vss electrical connection 128.

In some examples, the components 112 can have electrical connections that are spaced apart, center-to-center, by a first value, and the vertical interconnects 126 can be spaced apart, center-to-center, by the first value. In other examples, manufacturing constraints may not be able to space the vertical interconnects 126 as closely as the electrical connections of the components 112. For these examples, the components 112 can have electrical connections that are spaced apart, center-to-center, by a first value, and the vertical interconnects 126 can be spaced apart, center-to-center, by a second value greater than the first value.

In some examples, such as the configuration shown in FIGS. 1 and 2, the vertically-extending member can have a cross-section, taken in a plane parallel to the first side 118 or the second side 120 of the stiffener 116, that remains constant from the first side 118 of the stiffener 116 (e.g., the bottom of the recess 122) to the second side 120 of the stiffener 116 (e.g., the electrical connection that faces the package substrate 102). There can be alternate configurations fir the vertically-extending member, which are discussed below with regard to FIG. 3.

Returning to FIGS. 1 and 2, each recess 122 can define a respective recess volume that extends into the first side 118 of the stiffener 116. In some examples, the recess volume can include generally orthogonal walls, which can be formed by stamping, drilling, trenching, or one or more other suitable manufacturing techniques that can produce vertical walls on a generally horizontal or layered structure. For these examples, the recess area can remain constant from the first side 118 of the stiffener 116 to the second side 120 of the stiffener 116. In other examples, the recess volume can include one or more tapered walls, which can taper inward at increasing depths into the stiffener 116, so that the recess area at the bottom of the recess 122 can be smaller than the recess area at the top of the recess 122 (e.g., at the plane 124 defined by the first side 118 of the stiffener 116).

In some examples, the stiffener 116 can define a central hole 132 extending from the first side 118 to the second side 120. For these examples, the stiffener 116 can include a peripheral region 134 that fully surrounds the central hole 132. For these examples, the recess 122 can be positioned in the peripheral region 134.

The chip package 100 can further include a chip 136, such as a logic processor or a central processing unit, that is electrically coupled to the package substrate 102 and extends into the central hole 132 of the stiffener 116. In some examples, the chip 136 may not extend beyond the plane 124 defined by the first side 118 of the stiffener 116, so that the stiffener 116 can at least partially electrically shield the chip 136 from the components 112. In other examples, the chip 136 can extend beyond the plane 124. The chip package 100 can optionally include one or more additional chips that extend into the central hole 132 of the stiffener 116.

The stiffener 116 can be formed from an electrically conductive material that at least partially electrically shields the recess volumes from one another. In some examples, the electrically conductive material can be a conductive metal, such as copper, aluminum, stainless steel, or another suitable metal. When there are components 112, such as dies, present in the recesses 122, the stiffener 116 can at least partially electrically shield the components 112 from one another. Further, when there are one or more additional chips that extend from the package substrate 102 into the central hole 132 of the stiffener 116, the stiffener 116 can at least partially electrically shield the chip or chips from the components 112.

Figure 3:
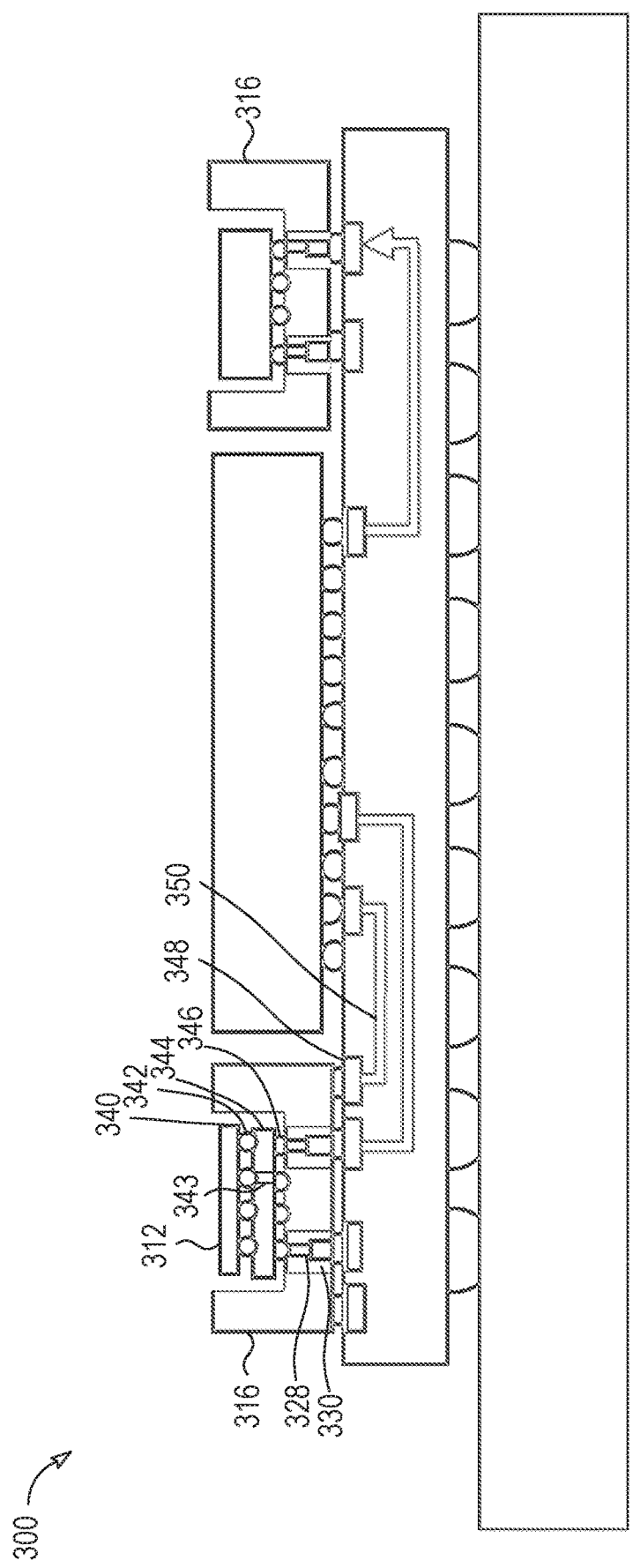
FIG. 3 shows a cross-sectional side view of another example of a chip package that includes an electrically conductive stiffener, in accordance with some examples.

As an alternative to the configuration of FIGS. 1 and 2, FIG. 3 shows a cross-sectional side view of another example of a chip package 300 that includes an electrically conductive stiffener 316, in accordance with some examples. The configuration of FIG. 3 is but another example of such a chip package; other configurations can also be used.

Many elements of the chip package 300 are the same as for chip package 100 of FIGS. 1 and 2. For these elements in common, the element numbers are omitted in FIG. 3, for clarity. There are three differences between the chip package 300 and the chip package 100 of FIGS. 1 and 2, as detailed below. Each of these three differences can be used independently of the other two, or mix-and-matched in any suitable combination.

A first difference pertains to the vertically-extending members 328 that form the vertical interconnects. In the configuration of FIGS. 1 and 2, each vertically-extending member 126 can have a constant cross-section from the bottom of the vertically-extending member 126 to the top of the vertically-extending member 126. In contrast, in the configuration of FIG. 3, a vertically-extending member 328, insulated by a dielectric layer 330, can have a cross-section, taken in a plane parallel to the first or second sides of the stiffener, that varies from the first side of the stiffener to the second side of the stiffener. For example, the cross-section can increase in size from the first side of the stiffener to the second side of the stiffener. The increase can be continuous, stepwise, or a combination of continuous and one or more discrete steps. Such a variation in cross-sectional size of the vertically-extending member 328 can match a cross-sectional size of the vertically-extending member 328 to a corresponding connector on a component (e.g., at the first side of the stiffener) or to a corresponding connector on the package substrate (e.g., at the second side of the stiffener). Matching the cross-sectional size in this manner can improve a robustness of the electrical connections, and can help ease manufacturing and/or placement tolerances. In some examples, all of the vertical interconnects vary in cross-sectional size from the first side of the stiffener to the second side of the stiffener. In other examples, at least one of the vertical interconnects varies in cross-sectional size from the first side of the stiffener to the second side of the stiffener. For example, use of a variable cross-sectional size can vary from recess-to-recess (e.g., a first recess can use a variable cross-sectional size, while a second recess can use a constant cross-sectional size). In still other examples, because such a variation in size is optional, none of the vertical interconnects may vary in cross-sectional size from the first side of the stiffener to the second side of the stiffener.

A second difference pertains to the component 312. In the configuration of FIGS. 1 and 2, each component 112 can be a die, or other suitable component having a single layer of connectors that face the stiffener. In contrast, in the configuration of FIG. 3, the component 312 can be a stacked component, such as stacked memory. The component 312 can include a first layer 340, such as a silicon die with a plurality of transistor devices and metal interconnects, having a first set of electrical connectors 342, such as electrical bumps. The first set of electrical connectors 342 can connect to a second layer 344 through a plurality of through silicon via (TSV) interconnects 343. The second layer 344 can having a second set of electrical connectors 346, which connect to the stiffener. Alternatively, there can be more than two layers, with more than two corresponding sets of electrical connectors. In some examples, all the components are stacked. In other examples, only one or more of the components are stacked. In still other examples, because stacking is optional, none of the components may be stacked.

A third difference pertains to electrically connecting to the stiffener. In the configuration of FIGS. 1 and 2, the stiffener can be electrically connected to a reference voltage through one or more electrical connections 128. In the configuration of FIG. 3, the electrically conductive material of the stiffener can electrically connect to a reference voltage on the substrate, such as a ground (Vss), or other suitable reference voltage. Such a connection can be formed through a connector 348, such as a solder bump, on a bottom of the stiffener, through circuitry 350 in the package substrate, to one or more other components electrically connected to the reference voltage in the chip package 300.

FIGS. 4-12 show an assembly process for the chip package 100 or 300, as various components of the chip package are formed and attached to one another.

Figure 4:
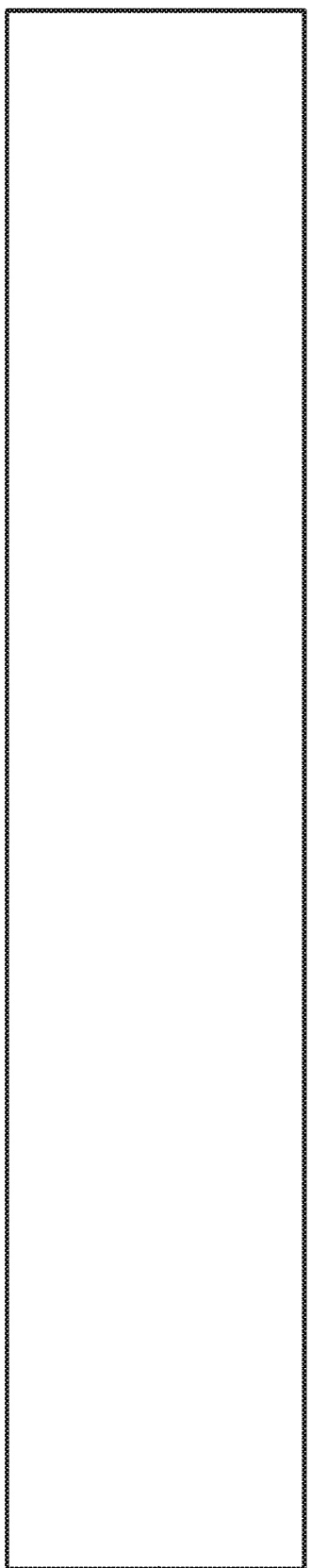

FIG. 4 shows a portion of a body 400 of stiffener material, such as stainless steel, copper, aluminum, or other conductive metal, in accordance with some examples. The body 400 can initially be rectangular in shape, and can lack the recesses that appear in the finished stiffener. In some examples, the thickness of the stiffener body 400 of can be between 0.1 mm and 0.5 mm, inclusively; other suitable thickness ranges can also be used.

Figure 5:
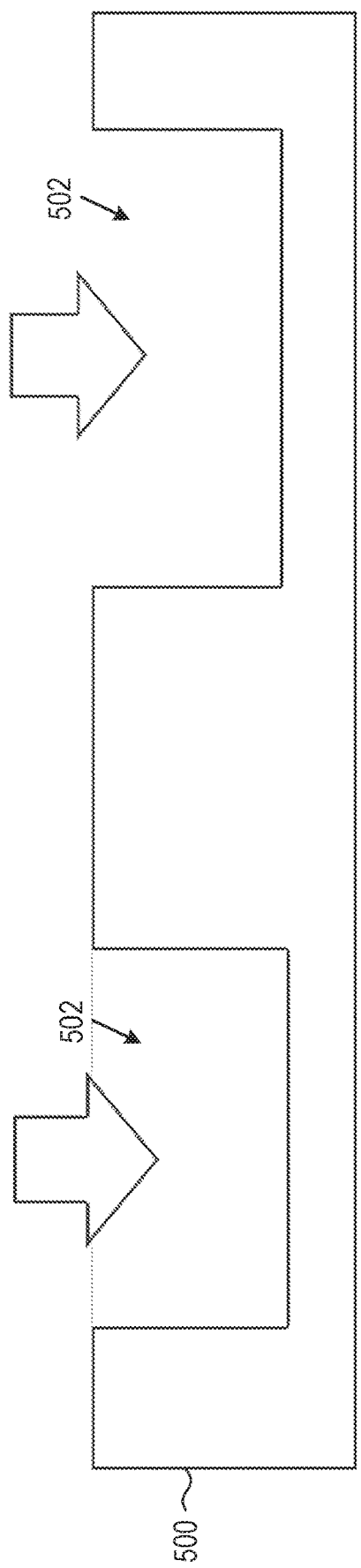

FIG. 5 shows a portion of the body 500, after one or more stamping, drilling, and/or trenching processes have formed the recesses 502, in accordance with some examples. In some examples, all the recesses 502 are formed at the same depth. In other examples, at least two of the recesses 502 are formed at different depths.

Figure 6:
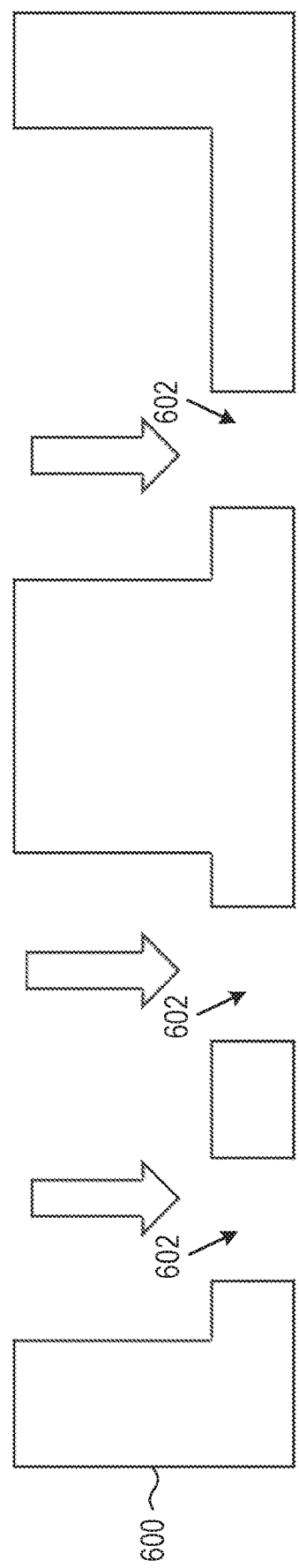

FIG. 6 shows a portion of the body 600, after a drilling process has formed first holes 602 through the body 600, through bottoms of the recesses, in accordance with some examples. In some examples, at least one first hole 602 may extend over an area of more than one vertical interconnect.

Figure 7:
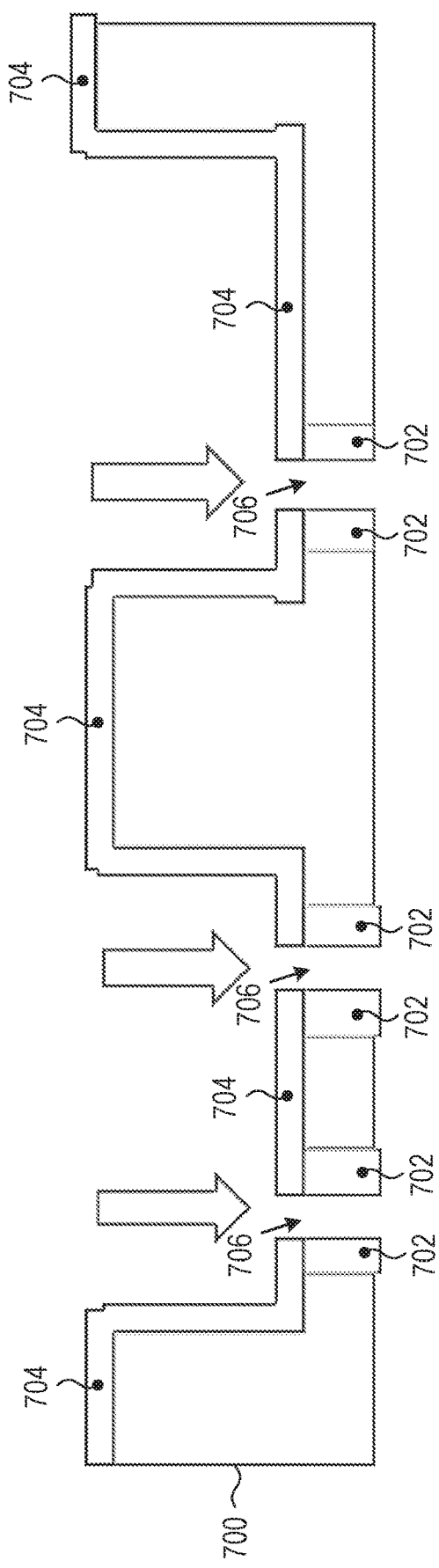

FIG. 7 shows a portion of the body 700, after the first holes 602 have been filled with a dielectric material 702, a dielectric/dry film resist 704 has been deposited on top of the body 700 and the dielectric material 702, and second holes 706 have been drilled through the dielectric/dry film resist 704 and the dielectric material 702, in accordance with some examples. In some examples, where a first hole 602 corresponds to more than one vertical interconnect, there can be more than one second hole 706 corresponding to the first hole 602. In some examples, the second holes 706 can be formed through an etching processes, such as a laser etching, rather than a mechanical drill, which can impart great precision to the locations of the second holes 706. The precisely-located second holes 706 can determine the locations of electrical connectors on the attached components. Note that the first holes 602 need not be formed as precisely as the second holes 706, because any positional errors in the first holes 602 may change the edges of the regions filled with dielectric material 702, but would not create any downstream misalignments between corresponding electrical connectors.

Figure 8:
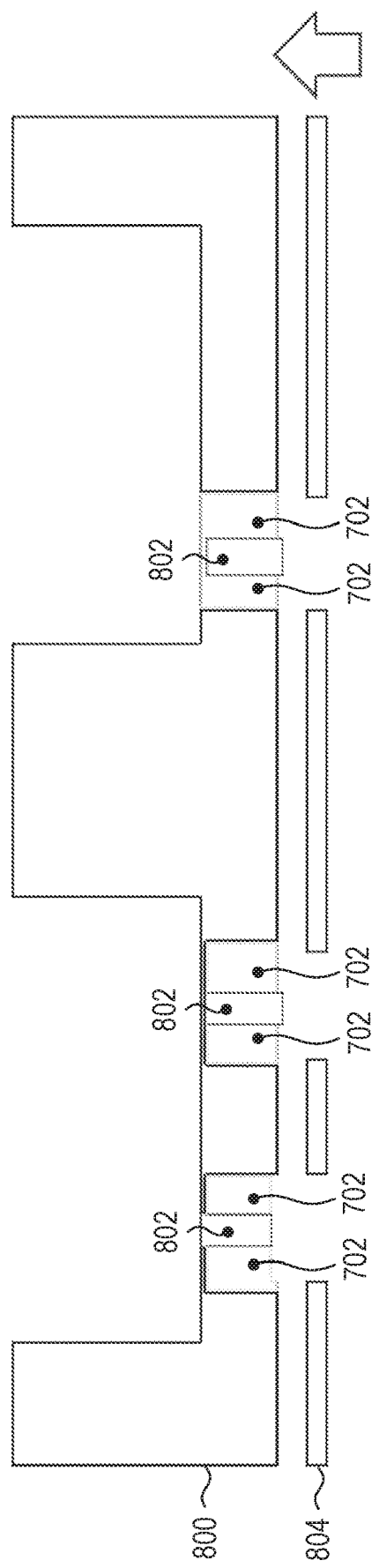

FIG. 8 shows a portion of the body 800, after the second holes 706 have been filled with an electrically conductive material 802, the dielectric/dry film resist 704 has been removed, and an adhesive layer 804 is to be applied to a bottom of the body 800, in accordance with some examples. The electrically conductive material 802 forms the vertical interconnects in the finished stiffener. Note that two or more vertical interconnects can be separated by just dielectric material 702, for closely-spaced connectors on the components.

FIG. 9 shows a cross-sectional side view of the body 900, after a central hole 902 has been drilled through the body 900, after stacked memory dice 904 have been attached to the body 900 in a recess 906, and a radio frequency integrated circuit 908 has been attached to the body 900 in a recess 910, in accordance with some examples. After the central hole 902 has been drilled, the body 900 forms the finished stiffener. The stacked memory dice 904 can include one or more through silicon via (TSV) interconnects 912.

Figure 10:
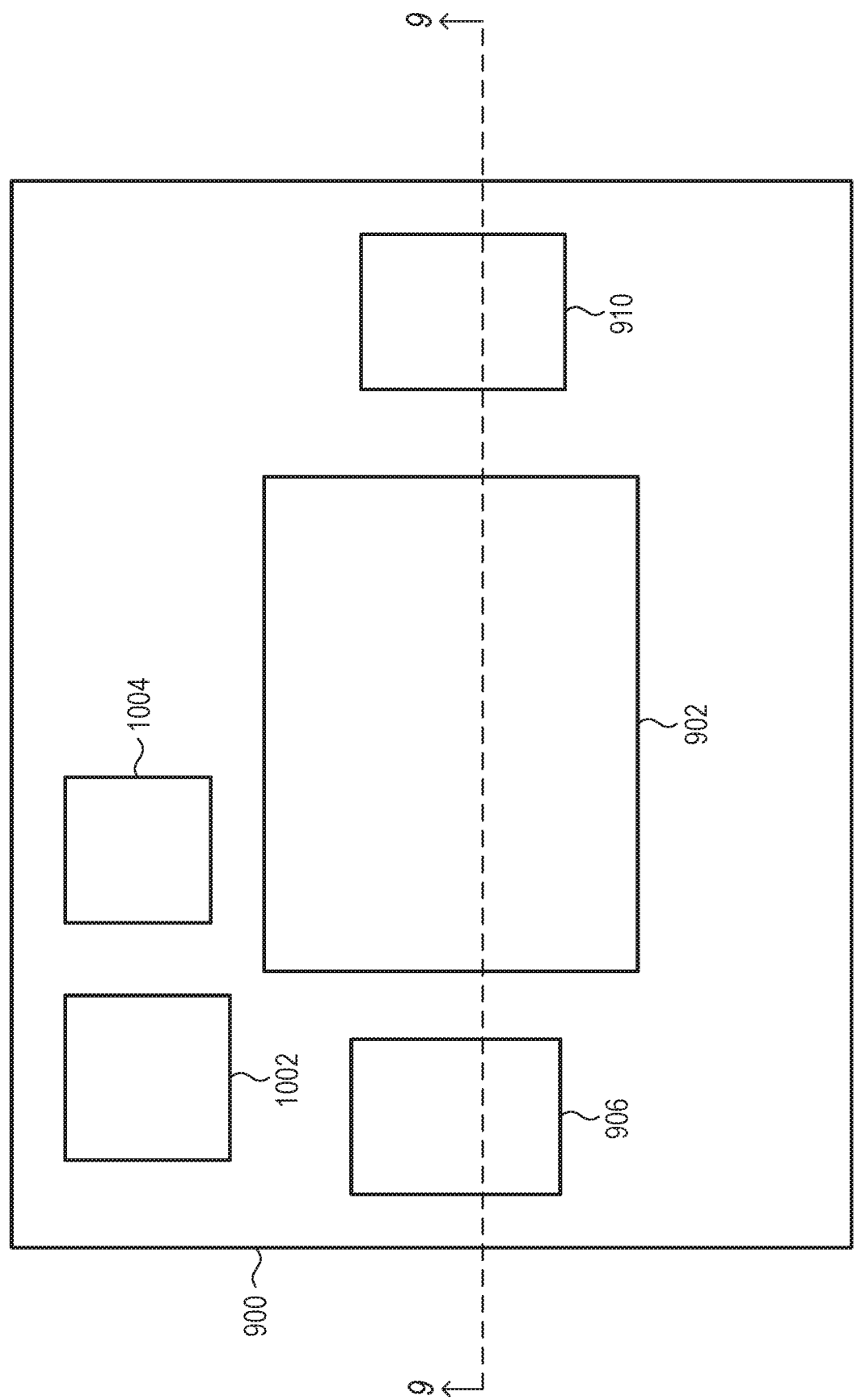

FIG. 10 shows a top view of the body 900, in accordance with some examples. The stacked memory dice 904 and the radio frequency integrated circuit 908 are not shown in FIG. 10. Note that recesses 906 and 910 merely extend into the body 900, while central hole 902 extends frilly through the body 900. Additional recesses 1002 and 1004 also extend into the body 900.

Figure 11:
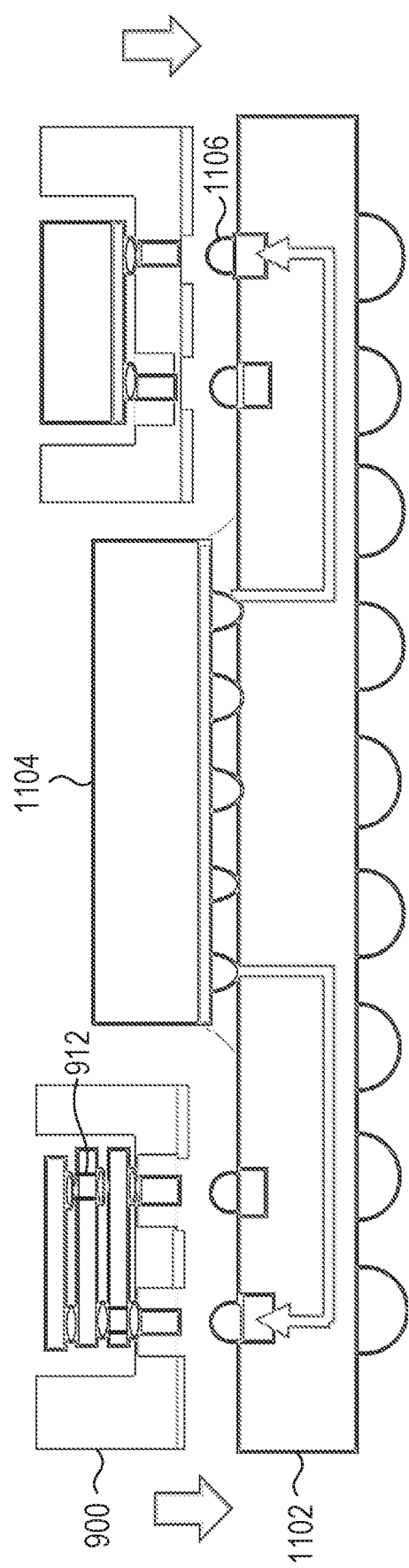

FIG. 11 shows a cross-sectional side view of the body 900 to be positioned onto a corresponding package substrate 1102, in accordance with some examples. A chip 1104 on the package substrate 1102 can extend into and/or through the central hole 902 when the body 900 is attached to the package substrate 1102. The memory dice and radio frequency integrated circuit can connect through the vertical interconnects to solder paste balls 1106 on a top side of the package substrate 1102. In some examples, a solder paste ball 1106 can include a low temperature solder material with a reflow temperature lower than the electrical connectors applied for the chip 1104. In some examples, electrical connectors for the components can reside within the recesses.

Figure 12:
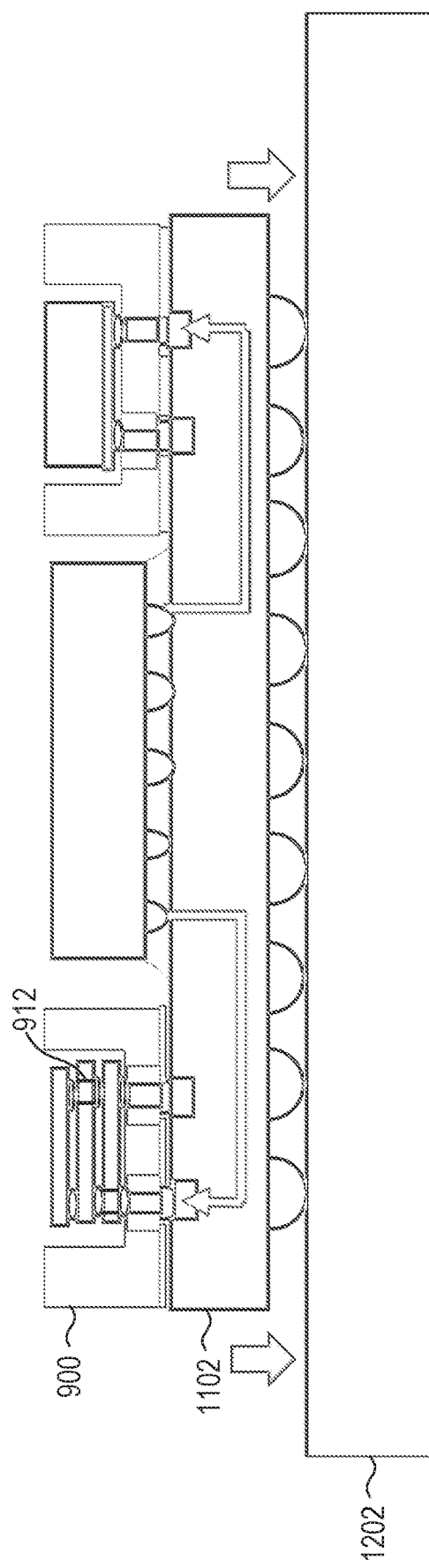

FIG. 12 shows a cross-sectional side view of the body 900 and the package substrate 1102, together, to be positioned onto a printed circuit board 1202, in accordance with some examples.

Figure 13:
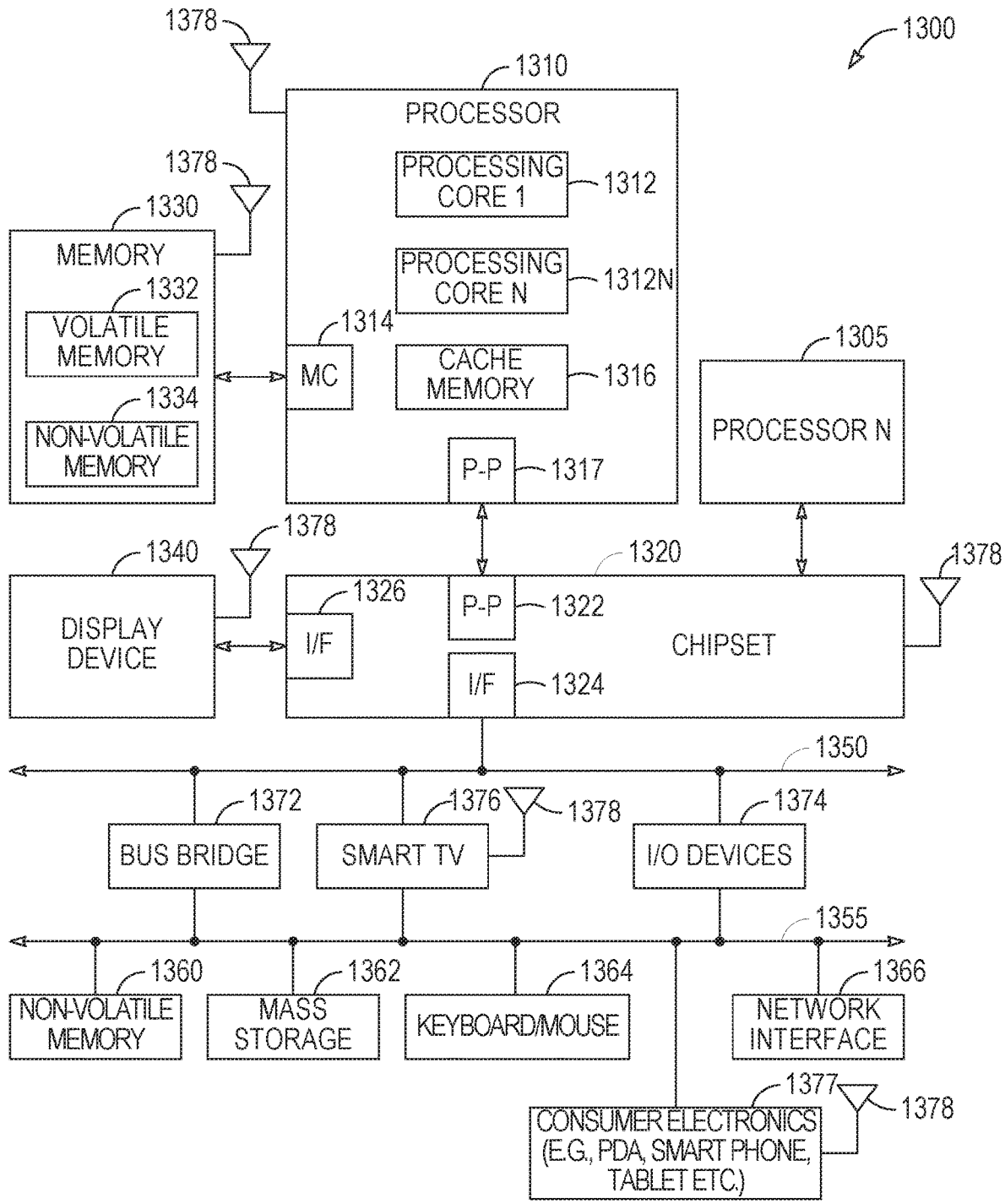
FIG. 13 illustrates a system level diagram, depicting an example of an electronic device (e.g., system) including the stiffener and system as described in the present disclosure.

FIG. 13 illustrates a system level diagram, depicting an example of an electronic device (e.g., system) including the stiffener and system as described in the present disclosure. FIG. 13 is included to show an example of a higher-level device application for the stiffener and system. In one embodiment, system 1300 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 1300 is a system on a chip (SOC) system.

In one embodiment, processor 1310 has one or more processor cores 1312 and 1312N, where 1312N represents the Nth processor core inside processor 1310 where N is a positive integer. In one embodiment, system 1300 includes multiple processors including 1310 and 1305, where processor 1305 has logic similar or identical to the logic of processor 1310. In some embodiments, processing core 1312 includes, but is not limited to, pre-fetch logic to fetch instructions, decode logic to decode the instructions, execution logic to execute instructions and the like. In some embodiments, processor 1310 has a cache memory 1316 to cache instructions and/or data for system 1300. Cache memory 1316 may be organized into a hierarchal structure including one or more levels of cache memory.

In some embodiments, processor 1310 includes a memory controller 1314, which is operable to perform functions that enable the processor 1310 to access and communicate with memory 1330 that includes a volatile memory 1332 and/or a non-volatile memory 1334. In some embodiments, processor 1310 is coupled with memory 1330 and chipset 1320. Processor 1310 may also be coupled to a wireless antenna 1378 to communicate with any device configured to transmit and/or receive wireless signals. In one embodiment, an interface for wireless antenna 1378 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 1332 includes, but is not limited to, Synchronous Dynamic Random-Access Memory (SDRAM), Dynamic Random-Access Memory (DRAM), RAMBUS Dynamic Random-Access Memory (RDRAM), and/or any other type of random access memory device. Non-volatile memory 1334 includes, but is not limited to, flash memory, phase change memory (PCM), read-only memory (ROM), electrically erasable programmable read-only memory (EEPROM), or any other type of non-volatile memory device.

Memory 1330 stores information and instructions to be executed by processor 1310. In one embodiment, memory 1330 may also store temporary variables or other intermediate information while processor 1310 is executing instructions. In the illustrated embodiment, chipset 1320 connects with processor 1310 via Point-to-Point (PtP or P-P) interfaces 1317 and 1322. Chipset 1320 enables processor 1310 to connect to other elements in system 1300. In some embodiments of the example system, interfaces 1317 and 1322 operate in accordance with a PtP communication protocol such as the Intel® QuickPath Interconnect (QPI) or the like. In other embodiments, a different interconnect may be used.

In some embodiments, chipset 1320 is operable to communicate with processor 1310, 1305N, display device 1340, and other devices, including a bus bridge 1372, a smart TV 1376, I/O devices 1374, nonvolatile memory 1360, a storage medium (such as one or more mass storage devices) 1362, a keyboard/mouse 1364, a network interlace 1366, and various forms of consumer electronics 1377 (such as a PDA, smart phone, tablet etc.), etc. In one embodiment, chipset 1320 couples with these devices through an interface 1324. Chipset 1320 may also be coupled to a wireless antenna 1378 to communicate with any device configured to transmit and/or receive wireless signals.

Chipset 1320 connects to display device 1340 via interface 1326. Display 1340 may be, for example, a liquid crystal display (LCD), a light emitting diode (LED) array, an organic light emitting diode (OLED) array, or any other form of visual display device. In some embodiments of the example system, processor 1310 and chipset 1320 are merged into a single SOC. In addition, chipset 1320 connects to one or more buses 1350 and 1355 that interconnect various system elements, such as I/O devices 1374, non-volatile memory 1360, storage medium 1362, a keyboard/mouse 1364, and network interface 1366. Buses 1350 and 1355 may be interconnected together via a bus bridge 1372.

In one embodiment, mass storage device 1362 includes, but is not limited to, a solid-state drive, a hard disk drive, a universal serial bus flash memory drive, or any other form of computer data storage medium. In one embodiment, network interface 1366 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 13 are depicted as separate blocks within the system 1300, the functions performed by some of these blocks may be integrated within a single semiconductor circuit or may be implemented using two or more separate integrated circuits. For example, although cache memory 1316 is depicted as a separate block within processor 1310, cache memory 1316 (or selected aspects of 1316) can be incorporated into processor core 1312.

Figure 14:
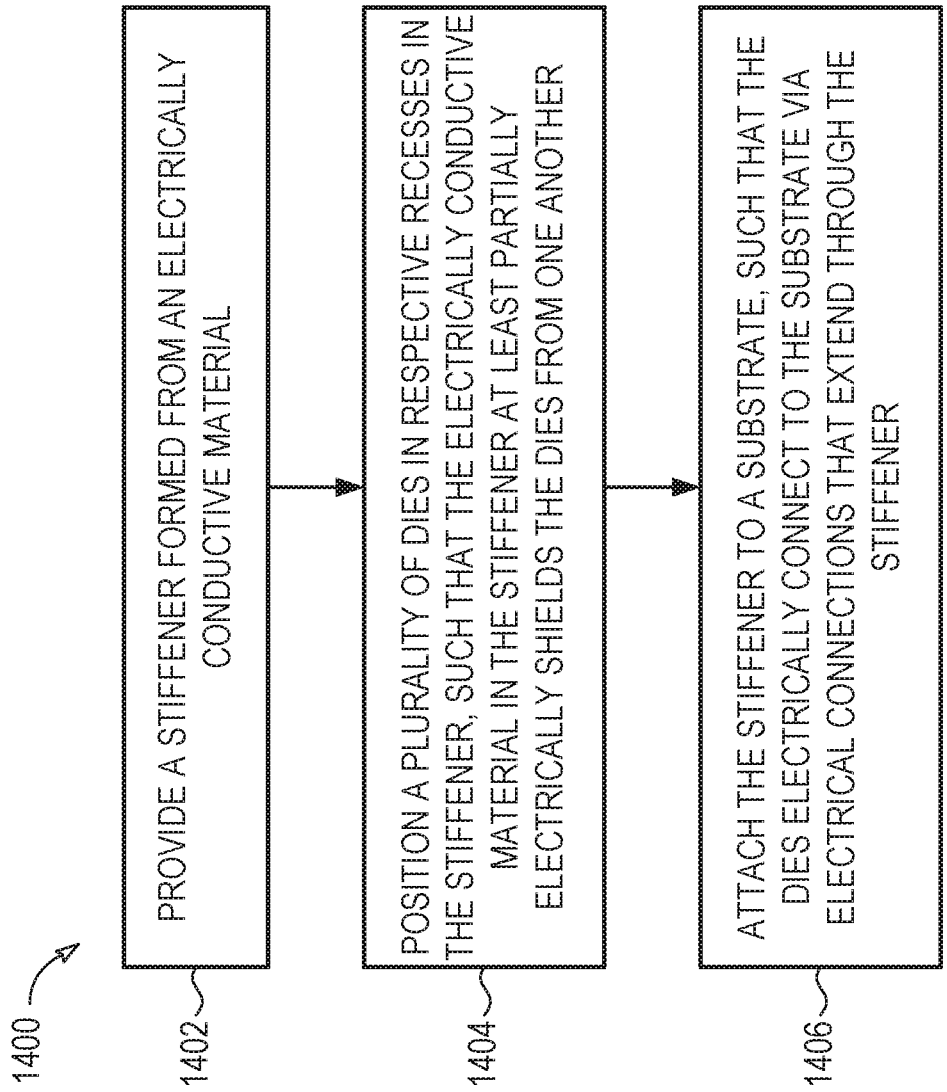
FIG. 14 shows a flowchart of an example of a method for implementing an electrically conductive stiffener that at least partially electrically shields the devices from one another, in accordance with some examples.

FIG. 14 shows a flowchart of an example of a method 1400 for implementing an electrically conductive stiffener that at least partially electrically shields the devices from one another, in accordance with some examples. The method 1400 is suitable for implementing the stiffeners 100, 300 shown in FIGS. 1-3, and for other suitable stiffeners. The method 1400 is but one suitable method; other suitable methods can also be used.

At operation 1402, a stiffener is provided. The stiffener can be formed from an electrically conductive material.

At operation 1404, a plurality of dies can be positioned in respective recesses in the stiffener, such that the electrically conductive material in the stiffener at least partially electrically shields the dies from one another.

At operation 1406, the stiffener can be attached to a substrate, such that the dies electrically connect to the substrate via electrical connections that extend through the stiffener.

In the foregoing detailed description, the method and apparatus of the present disclosure have been described with reference to specific embodiments thereof. It will, however, be evident that various modifications and changes may be made thereto without departing from the broader spirit and scope of the present disclosure. The present specification and figures are accordingly to be regarded as illustrative rather than restrictive.

To further illustrate the device and related method disclosed herein, a non-limiting list of examples is provided below. Each of the following non-limiting examples can stand on its own, or can be combined in any permutation or combination with any one or more of the other examples.

In Example 1, a chip package can include: a substrate; a stiffener coupled to the substrate; and a plurality of dies positioned in respective recesses in the stiffener and electrically connected to the substrate through the stiffener; wherein the stiffener is formed from an electrically conductive material that at least partially electrically shields the dies from one another.

In Example 2, the chip package of Example 1 can optionally be configured such that the stiffener has a first side and a second side opposite the first side; the stiffener includes the recesses on the first side; each recess extends over a respective recess area on the first side; and each recess extends to a respective plurality of electrical connections that extend through the stiffener to the second side of the stiffener.

In Example 3, the chip package of any one of Examples 1-2 can optionally be configured such that each electrical connection is formed as a vertical interconnect insulated by a dielectric layer.

In Example 4, the chip package of any one of Examples 1-3 can optionally be configured such that the dies have electrical connections that are spaced apart, center-to-center, by a first value; and the vertical interconnects are spaced apart, center-to-center, by the first value.

In Example 5, the chip package of any one of Examples 1-4 can optionally be configured such that the dies have electrical connections that are spaced apart, center-to-center, by a first value; and the vertical interconnects are spaced apart, center-to-center, by a second value greater than the first value.

In Example 6, the chip package of any one of Examples 1-5 can optionally be configured such that each recess defines a respective recess volume that extends into the first side of the stiffener; and the electrically conductive material of the stiffener at least partially electrically shields the recess volumes from one another.

In Example 7, the chip package of any one of Examples 1-6 can optionally be configured such that the second side of the stiffener is planar; and the first side of the stiffener, away from the recesses, defines a plane that is parallel to the second side.

In Example 8, the chip package of any one of Examples 1-7 can optionally be configured such that the recesses extend only partially into the stiffener; and the recesses have a same depth, so that the stiffener has a reduced thickness in the recess areas, and a nominal thickness away from the recesses.

In Example 9, the chip package of any one of Examples 1-8 can optionally be configured such that the reduced and nominal thicknesses differ by an amount greater than a height of at least one of the dies, so that when the dies are positioned in the recesses, the at least one die does not extend beyond the plane defined by the first side of the stiffener.

In Example 10, the chip package of any one of Examples 1-9 can optionally be configured such that the stiffener defines a central hole extending from the first side to the second side; the stiffener includes a peripheral region that fully surrounds the central hole; and the recesses are positioned in the peripheral region.

In Example 11, the chip package of any one of Examples 1-10 can optionally further include a chip coupled to the substrate and extending into the central hole of the stiffener.

In Example 12, the chip package of any one of Examples 1-11 can optionally be configured such that the chip does not extend beyond the plane defined by the first side of the stiffener.

In Example 13, the chip package of any one of Examples 1-12 can optionally be configured such that the electrically conductive material of the stiffener is electrically connected to a reference voltage on the substrate.

In Example 14, the chip package of any one of Examples 1-13 can optionally be configured such that the substrate extends over a substrate area; and the stiffener extends over a stiffener area smaller than the substrate area.

In Example 15, a method can include: providing a stiffener formed from an electrically conductive material; positioning a plurality of dies in respective recesses in the stiffener, such that the electrically conductive material in the stiffener at least partially electrically shields the dies from one another; and attaching the stiffener to a substrate, such that the dies electrically connect to the substrate via electrical connections that extend through the stiffener.

In Example 16, providing the stiffener can optionally include: providing a body formed from an electrically conductive material; forming the recesses in the stiffener by removing material from a top side of the body; drilling a plurality of first holes through the body, the first holes being positioned in the recesses; filling the first holes with a dielectric material; depositing a dielectric/dry film resist layer on the top side of the body; forming a plurality of second holes through the dielectric/dry film resist layer and through the dielectric material, the second holes being formed from an etching process, the second holes being positioned to determine locations of the electrical connections that extend through the stiffener; filling the second holes with an electrically conductive material; removing the dielectric/dry film resist layer; and attaching an adhesive layer to a bottom side of the body.

In Example 17, the method of any one of Examples 15-16 can optionally be configured such that the electrically conductive material has a constant cross section, taken in a plane parallel to the bottom side of the body, from the top side of the body to the bottom side of the body.

In Example 18, the method of any one of Examples 15-17 can optionally be configured such that the electrically conductive material has a cross section, taken in a plane parallel to the bottom side of the body, that increases in size from the top side of the body to the bottom side of the body.

In Example 19, a chip package can include: a stiffener having a first side and a second side opposite the first side, the stiffener including a plurality of recesses on the first side, each recess extending over a respective recess area on the first side, each recess area including a respective plurality of electrical connections that extend through the stiffener to the second side of the stiffener, each recess defining a respective recess volume that extends into the first side of the stiffener, the stiffener being formed from an electrically conductive material that at least partially electrically shields the recess volumes from one another.

In Example 20, the chip package of Example 19 can optionally further include: a substrate coupled to the second side of the stiffener; and a plurality of dies positioned in respective recesses in the stiffener and electrically connected to the substrate through the stiffener via the electrical connections that extend through the stiffener to the second side of the stiffener; wherein: the second side of the stiffener is planar; and the first side of the stiffener, away from the recesses, defines a plane that is parallel to the second side; the recesses extend only partially into the stiffener; the recesses have a same depth, so that the stiffener has a first thickness in the recess areas, and a second thickness away from the recesses; and the first and second thicknesses differ by an amount greater than a height of at least one of the dies, so that when the dies are positioned in the recesses, the at least one die does not extend beyond the plane defined by the first side of the stiffener.

What is claimed is:

1. A chip package, comprising:
   a substrate;
   a stiffener coupled to the substrate, the stiffener having a first side and a second side opposite the first side, the stiffener defining a central hole that extends from the first side to the second side, the stiffener including a peripheral region that fully surrounds the central hole, the stiffener including a plurality of recesses on the first side in the peripheral region, each recess defining a respective recess volume that extends into the first side of the stiffener, each recess extending to a respective plurality of electrical connections that extend through the stiffener to the second side of the stiffener; and
   a plurality of dies positioned in respective recesses of the plurality of recesses and electrically connected to the substrate through the stiffener;
   wherein the stiffener is formed from an electrically conductive material that at least partially electrically shields the recess volumes from one another and at least partially electrically shields the dies from one another.

2. The chip package of claim 1, wherein each electrical connection is formed as a vertical interconnect insulated by a dielectric layer.

3. The chip package of claim 2, wherein:
   the dies have electrical connections that are spaced apart, center-to-center, by a first value; and
   the vertical interconnects are spaced apart, center-to-center, by the first value.

4. The chip package of claim 2, wherein:
   the dies have electrical connections that are spaced apart, center-to-center, by a first value; and
   the vertical interconnects are spaced apart, center-to-center, by a second value greater than the first value.

5. The chip package of claim 1, wherein:
   the second side of the stiffener is planar; and
   the first side of the stiffener, away from the recesses, defines a plane that is parallel to the second side.

6. The chip package of claim 5, wherein:
   each recess extends over a respective recess area on the first side;
   the recesses extend only partially into the stiffener; and
   the recesses have a same depth, so that the stiffener has a reduced thickness in the recess areas, and a nominal thickness away from the recesses.

7. The chip package of claim 6, wherein:
   the reduced and nominal thicknesses differ by an amount greater than a height of at least one of the dies, so that when the dies are positioned in the recesses, the at least one die does not extend beyond the plane defined by the first side of the stiffener.

8. The chip package of claim 1, further comprising a chip coupled to the substrate and extending into the central hole of the stiffener.

9. The chip package of claim 8, wherein the chip does not extend beyond the plane defined by the first side of the stiffener.

10. The chip package of claim 1, wherein the electrically conductive material of the stiffener is electrically connected to a reference voltage on the substrate.

11. The chip package of claim 1, wherein:
    the substrate extends over a substrate area; and
    the stiffener extends over a stiffener area smaller than the substrate area.

12. A method, comprising:
    providing a stiffener formed from an electrically conductive material, the stiffener having a first side and a second side opposite the first side, the stiffener defining a central hole that extends from the first side to the second side, the stiffener including a peripheral region that fully surrounds the central hole, the stiffener including a plurality of recesses on the first side in the peripheral region, each recess defining a respective recess volume that extends into the first side of the stiffener, the electrically conductive material of the stiffener at least partially electrically shielding the recess volumes from one another, each recess extending to a respective plurality of electrical connections that extend through the stiffener to the second side of the stiffener;
    positioning a plurality of dies in respective recesses in the stiffener, such that the electrically conductive material in the stiffener at least partially electrically shields the dies from one another; and
    attaching the stiffener to a substrate, such that the dies electrically connect to the substrate via at least some of the electrical connections.

13. The method of claim 12, wherein providing the stiffener comprises:
    providing a body formed from an electrically conductive material;
    forming the recesses in the stiffener by removing material from a top side of the body;

drilling a plurality of first holes through the body, the first holes being positioned in the recesses;

filling the first holes with a dielectric material;

depositing a dielectric/dry film resist layer on the top side of the body;

forming a plurality of second holes through the dielectric/dry film resist layer and through the dielectric material, the second holes being formed from an etching process, the second holes being positioned to determine locations of the electrical connections that extend through the stiffener;

filling the second holes with an electrically conductive material;

removing the dielectric/dry film resist layer; and attaching an adhesive layer to a bottom side of the body.

14. The method of claim 13, wherein the electrically conductive material has a cross section, taken in a plane parallel to the bottom side of the body, that increases in size from the top side of the body to the bottom side of the body.

15. A chip package, comprising:

a stiffener having a first side and a second side opposite the first side, a substrate coupled to the second side of the stiffener, the stiffener defining a central hole that extends from the first side to the second side, the stiffener including a peripheral region that fully surrounds the central hole, the stiffener including a plurality of recesses on the first side in the peripheral region, each recess extending over a respective recess area on the first side, each recess area including a respective plurality of electrical connections that extend through the stiffener to the second side of the stiffener, a plurality of dies positioned in respective recesses in the stiffener and electrically connected to the substrate through the stiffener via the electrical connections that extend through the stiffener to the second side of the stiffener, each recess defining a respective recess volume that extends into the first side of the stiffener, the stiffener being formed from an electrically conductive material that at least partially electrically shields the recess volumes from one another.

16. The chip package of claim 15, further comprising:

the second side of the stiffener is planar;

the first side of the stiffener, away from the recesses, defines a plane that is parallel to the second side;

the recesses extend only partially into the stiffener;

the recesses have a same depth, so that the stiffener has a first thickness in the recess areas, and a second thickness away from the recesses; and the first and second thicknesses differ by an amount greater than a height of at least one of the dies, so that when the dies are positioned in the recesses, the at least one die does not extend beyond the plane defined by the first side of the stiffener.

* * * * *